US007009453B2

(12) United States Patent
Kuriyama

(10) Patent No.: US 7,009,453 B2
(45) Date of Patent: Mar. 7, 2006

(54) BIAS CURRENT SUPPLY CIRCUIT AND AMPLIFICATION CIRCUIT

(75) Inventor: Yasuhiko Kuriyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 10/797,083

(22) Filed: Mar. 11, 2004

(65) Prior Publication Data
US 2004/0232992 A1   Nov. 25, 2004

(30) Foreign Application Priority Data
Mar. 12, 2003 (JP) .............................. 2003-066733

(51) Int. Cl.
*H03F 3/04* (2006.01)
(52) U.S. Cl. ...................................... 330/289; 330/296
(58) Field of Classification Search ................. 330/289, 330/285, 296, 288
See application file for complete search history.

(56) References Cited

U.S. PATENT DOCUMENTS 6,052,032 A * 4/2000 Jarvinen ...................... 330/289
6,806,775 B1 * 10/2004 Abe ............................ 330/297
6,946,913 B1 * 9/2005 Moriwaki et al. ........... 330/296

* cited by examiner

Primary Examiner—Henry Choe
(74) Attorney, Agent, or Firm—Oblon, Spivak, McClelland, Maier & Neustadt, P.C.

(57) ABSTRACT

A bias current supply circuit according to an embodiment of the invention includes a first transistor and a second transistor which form two emitter followers cooperating to supply a base bias current of a bipolar transistor for signal amplification, a normal temperature characteristic circuit which has normal temperature characteristics increasing an amount of current supply with increasing temperature and supplies a base current to the first bipolar transistor, and a reverse temperature characteristic circuit which has reverse temperature characteristics decreasing the amount of current supply with increasing temperature and supplies a base current to the second bipolar transistor.

11 Claims, 7 Drawing Sheets

BIAS CURRENT SUPPLY CIRCUIT AND AMPLIFICATION CIRCUIT

CROSS REFERENCE TO RELATED APPLICATION

The subject application is related to subject matter disclosed in Japanese Patent Application No. 2003-066733 filed on Mar. 12, 2003 in Japan to which the subject application claims priority under Paris Convention and which is incorporated herein by reference.

BACKGROUND OF THE INVENTION

1. Field of the Invention

The present invention relates to a bias current supply circuit and an amplification circuit including the bias current supply circuit. Particularly the invention relates to the high-efficiency, high-power amplification circuit which is configured to use a bipolar transistor and operated by low power-supply voltage, and the bias current supply circuit which is added to the amplification circuit.

2. Related Background Art

In the high-efficiency, high-power amplification circuit which is configured to use the bipolar transistor and operated by the low power-supply voltage, since a collector current is greatly influenced by a fluctuation in temperature, a base bias current is supplied by a current mirror circuit which is configured to use a diode-connected bipolar transistor.

FIG. 1 shows a circuit diagram of a first example of the conventional current mirror type base bias current supply circuits.

The current mirror circuit shown in FIG. 1 is the current mirror type base bias current supply circuit having the simplest configuration. The current mirror circuit includes a resistor R and a diode-connected bipolar transistor Q which are connected in series between a control potential node to which control voltage $V_{con}$ is supplied and a ground potential node, and the base bias current is supplied from a connection node OUT between the resistor R and a collector of the transistor Q.

The high-efficiency amplifier having a wide output dynamic range and linearity of gain can be realized by setting a bias condition to class B to cut passage of idle current. However, in actual fact, since strain caused by a fluctuation in gain is increased by non-linearity of mutual conductance of an element, the linearity of the gain is maintained in the wide output dynamic range by setting the bias condition to class AB in which the idle current passes through the amplifier to a certain extent.

In the class AB amplification circuit configured to use the bipolar transistor, since average collector current is increased according to an increase in output level, it is necessary that a bias circuit sufficiently supplies an increased amount in average base current according to the increase in average collector current. However, in the current mirror circuit including the diode-connected bipolar transistor shown in FIG. 1, the sufficient current can not be supplied.

Therefore, the current mirror circuit which supplies base current through an emitter follower circuit is widely used in order to decrease output impedance.

FIG. 2 shows the circuit diagram of a second example of the conventional current mirror type base bias current supply circuits.

The conventional current mirror type base bias current supply circuit shown in FIG. 2 includes a resistor R1 and diode-connected bipolar transistors Q2 and Q1 which are sequentially connected in series between the control potential node to which the control voltage $V_{con}$ is supplied and the ground potential node, a bipolar transistor Q3 in which the collector is connected to a power supply potential node to which power supply voltage $V_{cc}$ is supplied and a base is connected to a collector of the transistor Q2, and a resistor R2 which is connected between an emitter of the transistor Q3 and the ground potential node. The base bias current is supplied from the connection node OUT between the emitter of the transistor Q3 and the resistor R2.

However, since the conventional current mirror type base bias current supply circuit shown in FIG. 2 has the configuration in which the bipolar transistors are connected in two-stage series, unless the control voltage $V_{con}$ is sufficiently increased more than double voltage of on-voltage Vbeon of the transistor, it is impossible to maintain compensation for a fluctuation in bias current to temperature change, in which responsiveness is required.

However, in a system such as a cellular phone in which the control voltage is low, that the control voltage $V_{con}$ is increased is contrary to a flow of technical advance, so that there is generated a problem. Particularly, in the system in which linear operation is required in the wide output dynamic range like a CDMA communication system, a fluctuation in idle current caused by the temperature change, which is largely affected during low output, becomes the problem.

For the purpose of a countermeasure against the above problem, a complex type bias current supply circuit in which the transistor turned on by one-stage on-voltage Vbeon is added has been proposed.

FIG. 3 shows the circuit diagram of a third example of the conventional current mirror type base bias current supply circuits.

The conventional current mirror type base bias current supply circuit shown in FIG. 3 includes a resistor R1 and diode-connected bipolar transistors Q2 and Q1 which are sequentially connected in series between the control potential node to which the control voltage $V_{con}$ is supplied and the ground potential node, a bipolar transistor Q4 in which the collector is connected to the power supply potential node to which the power supply voltage $V_{cc}$ is supplied and the base is connected to the collector of the transistor Q2, a resistor R2 which is connected between the control potential node and the emitter of the transistor Q4, and a diode-connected bipolar transistor Q3 which is connected between the emitter of the transistor Q4 and the ground potential node. The base bias current is supplied from the connection node between the emitter of the transistor Q4 and the collector of the transistor Q3.

The base bias current is supplied to the base of a bipolar transistor RFTr for RF signal amplification through a choke inductor L. The transistor RFTr is connected between the power supply potential node and the ground potential node, an input RF signal $RF_{in}$ is inputted to the base of the transistor RFTr through a capacitor C, and an output RF signal $RF_{out}$ is outputted from the collector of the transistor RFTr.

FIG. 4 is a graph showing temperature characteristics of the collector bias current of the bipolar transistor for RF signal amplification to the control voltage $V_{con}$ in the case where the conventional current mirror type base bias current supply circuit shown in FIG. 3 is used. Specifically, the graphs T1, T2, and T3 show the temperature characteristics at ambient temperatures 90° C., 30° C., and −30° C. respectively.

In the case where the conventional current mirror type base bias current supply circuit shown in FIG. 3 is used, assuming that the control voltage $V_{con}$ is set to, e.g. the voltage as low as 2.8V, the collector bias currents of the bipolar transistor for RF signal amplification become 27 mA, 35 mA, and 45 mA at the ambient temperatures −30° C., 30° C., and 90° C. respectively. This fluctuation range is decreased and improved, compared with the case in which the conventional current mirror type base bias current supply circuit shown in FIG. 2 is used.

However, in the case where the conventional current mirror type base bias current supply circuit shown in FIG. 3 is used, in fact the fluctuation range is not sufficiently decreased, because it is necessary that the sufficient current passes through the transistor Q4 in order to decrease the output impedance.

Further, since the RF signal is leaked into the bias current supply circuit due to the low output impedance of the bias current supply circuit, as shown in FIG. 3, the choke inductor L arranged between the output node of the bias current supply circuit and the bipolar transistor RFTr for RF signal amplification is essential for prevention of the RF signal.

SUMMARY OF THE INVENTION

According to a basic configuration of a bias current supply circuit of a first embodiment of the invention, there is provided with a bias current supply circuit comprising:

a first bipolar transistor and a second bipolar transistor which form two emitter followers cooperating to supply a base bias current of a bipolar transistor for signal amplification;

a normal temperature characteristic circuit which has normal temperature characteristics increasing an amount of current supply with increasing temperature and supplies a base current to the first bipolar transistor; and a reverse temperature characteristic circuit which has reverse temperature characteristics decreasing the amount of current supply with increasing temperature and supplies a base current to the second bipolar transistor.

According to another aspect of the basic configuration of the bias current supply circuit of the first embodiment of the invention, there is provided with a bias current supply circuit comprising:

a first bipolar transistor and a resistor which are sequentially connected in series between a power supply potential node and a ground potential node;

a second bipolar transistor which is connected in parallel with the first bipolar transistor;

a normal temperature characteristic circuit which has normal temperature characteristics increasing an amount of current supply with increasing temperature and is operated by supply of a control voltage to control a base current supplied to the first bipolar transistor; and a reverse temperature characteristic circuit which has reverse temperature characteristics decreasing the amount of current supply with increasing temperature and is operated by the supply of the control voltage to control a base current supplied to the second bipolar transistor, wherein a base bias current of a bipolar transistor for signal amplification is supplied from emitters of the first and second bipolar transistors which are commonly connected.

According to a specific configuration of the bias current supply circuit of the first embodiment of the invention, there is provided-with a bias current supply circuit comprising:

a first bipolar transistor and a second bipolar transistor which are sequentially connected in series between a power supply potential node and a ground potential node;

a third bipolar transistor and a first diode-connected bipolar transistor which are sequentially connected in series between the power supply potential node and the ground potential node;

a first resistor which is connected between a control potential node and a base of the first bipolar transistor;

a fourth bipolar transistor in which a collector is connected to the base of the first bipolar transistor, a base is commonly connected to bases of the second bipolar transistor and the first diode-connected bipolar transistor, and an emitter is connected to the ground potential node;

a fifth bipolar transistor which is connected between the power supply potential node and an emitter of the first bipolar transistor;

a second resistor which is connected between the control potential node and a base of the fifth bipolar transistor;

a third resistor and a sixth bipolar transistor which are sequentially connected in series between the base of the fifth bipolar transistor and the ground potential node;

a seventh bipolar transistor which is connected between the power supply potential node and a base of the sixth bipolar transistor;

a fourth resistor which is connected between an emitter of the seventh bipolar transistor and the ground potential node;

a fifth resistor which is connected between the control potential node and a base of the seventh bipolar transistor; and a second diode-connected bipolar transistor and a third diode-connected bipolar transistor which are sequentially connected in series between the base of the seventh bipolar transistor and the ground potential node.

According to a basic configuration of a bias current supply circuit of a second embodiment of the invention, there is provided with a bias current supply circuit comprising:

a first bipolar transistor which forms an emitter follower supplying a base bias current of a bipolar transistor for signal amplification;

a second bipolar transistor which is connected in series to the first bipolar transistor;

a normal temperature characteristic circuit which has normal temperature characteristics increasing an amount of current supply with increasing temperature and supplies a base current to the first bipolar transistor; and a bias current compensation circuit which has the normal temperature characteristics increasing the amount of current supply with increasing temperature and suppresses an increase in the base bias current with increasing ambient temperature by supplying a base current to the second bipolar transistor to pass a part of the base bias current supplied from an emitter of the first bipolar transistor through the second bipolar transistor.

According to another aspect of the basic configuration of the bias current supply circuit of the first embodiment of the invention, there is provided with a bias current supply circuit comprising:

a first bipolar transistor and a second bipolar transistor which are sequentially connected in series between a power supply potential node and a ground potential node;

a normal temperature characteristic circuit which has normal temperature characteristics increasing an amount of current supply with increasing temperature and is operated by supply of a control voltage to control a base current supplied to the first bipolar transistor; and a bias current compensation circuit which has the normal temperature characteristics increasing the amount of current supply with increasing temperature, the bias current compensation circuit controlling a base bias current of a bipolar transistor for signal amplification, which is supplied from an emitter of the first bipolar transistor, in such a manner that the bias current compensation circuit is operated by supply of the control voltage to control a base current supplied to the second bipolar transistor.

According to a specific configuration of a bias current supply circuit of the embodiment of the invention, there is provided with a bias current supply circuit comprising:

a first bipolar transistor and a second bipolar transistor which are sequentially connected in series between a power supply potential node and a ground potential node;

a third bipolar transistor and a first diode-connected bipolar transistor which are sequentially connected in series between the power supply potential node and the ground potential node;

a first resistor which is connected between a control potential node and a base of the first bipolar transistor;

a fourth bipolar transistor in which a collector is connected to the base of the first bipolar transistor, a base is commonly connected to bases of the second bipolar transistor and the first diode-connected bipolar transistor, and an emitter is connected to the ground potential node;

a fifth bipolar transistor which is connected between an emitter of the first bipolar transistor and the ground potential node;

a sixth bipolar transistor in which a collector is connected to the power supply potential node and an emitter is connected to a base of the fifth bipolar transistor;

a second resistor which is connected between an emitter of the sixth bipolar transistor and the ground potential node;

a third resistor which is connected between the control potential node and a base of the sixth bipolar transistor; and a fourth resistor, a second diode-connected bipolar transistor, and a third diode-connected bipolar transistor which are sequentially connected in series between the base of the sixth bipolar transistor and the ground potential node.

According to a bias current supply circuit of a third embodiment of the invention, there is provided with a bias current supply circuit comprising:

a first resistor and a first bipolar transistor which are sequentially connected in series between a control potential node and a ground potential node;

a second bipolar transistor in which a collector is connected to a power supply potential node, a base is connected to a collector of the first bipolar transistor, and an emitter is connected to a base of the first bipolar transistor;

a second resistor which is connected between the emitter of the second bipolar transistor and the ground potential node;

a third bipolar transistor in which a collector is connected to the power supply potential node, a base is commonly connected to the base of the first bipolar transistor, and an emitter supplies a base bias current of a bipolar transistor for signal amplification;

a diode-connected bipolar transistor which is connected between the emitter of the third bipolar transistor and the ground potential node; and a third resistor which is connected between the control potential node and a connection node of the emitter of the third bipolar transistor and a collector of the diode-connected bipolar transistor.

According to a basic configuration of an amplification circuit of a first embodiment of the invention, there is provided with an amplification circuit comprising:

a first bipolar transistor and a second bipolar transistor which form two emitter followers cooperating to supply a base bias current of a bipolar transistor for signal amplification;

a normal temperature characteristic circuit which has normal temperature characteristics increasing an amount of current supply with increasing temperature and supplies a base current to the first bipolar transistor;

a reverse temperature characteristic circuit which has reverse temperature characteristics decreasing the amount of current supply with increasing temperature and supplies a base current to the second bipolar transistor; and the bipolar transistor for signal amplification which is connected between a power supply potential node and a ground potential node, a base of the bipolar transistor for signal amplification being connected to emitters of the first and second bipolar transistors, an input signal being inputted to a base of the bipolar transistor for signal amplification through a capacitor, an output signal being outputted from a collector of the bipolar transistor for signal amplification.

According to another aspect of the basic configuration of the amplification circuit of the first embodiment of the invention, there is provided with an amplification circuit comprising:

a first bipolar transistor and a resistor which are sequentially connected in series between a power supply potential node and a ground potential node;

a second bipolar transistor which is connected in parallel with the first bipolar transistor;

a normal temperature characteristic circuit which has normal temperature characteristics increasing an amount of current supply with increasing temperature and is operated by supply of a control voltage to control a base current supplied to the first bipolar transistor;

a reverse temperature characteristic circuit which has reverse temperature characteristics decreasing the amount of current supply with increasing temperature and is operated by the supply of the control voltage to control a base current supplied to the second bipolar transistor; and a bipolar transistor for signal amplification which is connected between the power supply potential node and the ground potential node, a base of the bipolar transistor for signal amplification being connected to emitters of the first and second bipolar transistors, an input signal being inputted to a base of the bipolar transistor for signal amplification through a capacitor, an output signal being outputted from a collector of the bipolar transistor for signal amplification.

According to a specific configuration of an amplification circuit of a first embodiment of the invention, there is provided with an amplification circuit comprising:

a first bipolar transistor and a second bipolar transistor which are sequentially connected in series between a power supply potential node and a ground potential node;

a third bipolar transistor and a first diode-connected bipolar transistor which are sequentially connected in series between the power supply potential node and the ground potential node;

a first resistor which is connected between a control potential node and a base of the first bipolar transistor;

a fourth bipolar transistor in which a collector is connected to the base of the first bipolar transistor, a base is commonly connected to bases of the second bipolar transistor and the first diode-connected bipolar transistor, and an emitter is connected to the ground potential node;

a fifth bipolar transistor which is connected between the power supply potential node and an emitter of the first bipolar transistor;

a second resistor which is connected between the control potential node and a base of the fifth bipolar transistor;

a third resistor and a sixth bipolar transistor which are sequentially connected in series between the base of the fifth bipolar transistor and the ground potential node;

a seventh bipolar transistor which is connected between the power supply potential node and a base of the sixth bipolar transistor;

a fourth resistor which is connected between an emitter of the seventh bipolar transistor and the ground potential node;

a fifth resistor which is connected between the control potential node and a base of the seventh bipolar transistor;

a second diode-connected bipolar transistor and a third diode-connected bipolar transistor which are sequentially connected in series between the base of the seventh bipolar transistor and the ground potential node; and a bipolar transistor for signal amplification which is connected between the power supply potential node and the ground potential node, a base of the bipolar transistor for signal amplification being connected to the emitter of the first bipolar transistor and an emitter of the fifth bipolar transistor, an input signal being inputted to the base of the bipolar transistor for signal amplification through a capacitor, an output signal being outputted from an collector of the bipolar transistor for signal amplification.

According to a basic configuration of an amplification circuit of a second embodiment of the invention, there is provided with an amplification circuit comprising:

a first bipolar transistor which forms an emitter follower supplying a base bias current of a bipolar transistor for signal amplification;

a second bipolar transistor which is connected in series to the first bipolar transistor;

a normal temperature characteristic circuit which has normal temperature characteristics increasing an amount of current supply with increasing temperature and supplies a base current to the first bipolar transistor;

a bias current compensation circuit which has the normal temperature characteristics increasing the amount of current supply with increasing temperature and suppresses an increase the the base bias current with increasing ambient temperature by supplying a base current to the second bipolar transistor to pass a part of the base bias current supplied from an emitter of the first bipolar transistor through the second bipolar transistor; and the bipolar transistor for signal amplification which is connected between a power supply potential node and a ground potential node, a base of the bipolar transistor for signal amplification being connected to the emitter of the first bipolar transistor, an input signal being inputted to the base of the bipolar transistor for signal amplification through a capacitor, an output signal being outputted from a collector of the bipolar transistor for signal amplification.

According to another aspect of the basic configuration of the amplification circuit of the second embodiment of the invention, there is provided with an amplification circuit comprising:

a first bipolar transistor and a second bipolar transistor which are sequentially connected in series between a power supply potential node and a ground potential node;

a normal temperature characteristic circuit which has normal temperature characteristics increasing an amount of current supply with increasing temperature and is operated by supply of a control voltage to control a base current supplied to the first bipolar transistor;

a bias current compensation circuit which has the normal temperature characteristics increasing the amount of current supply with increasing temperature, the bias current compensation circuit controlling a base bias current of a bipolar transistor for signal amplification, which is supplied from an emitter of the first bipolar transistor, in such a manner that the bias current compensation circuit is operated by supply of the control voltage to control a base current supplied to the second bipolar transistor; and the bipolar transistor for signal amplification which is connected between the power supply potential node and the ground potential node, a base of the bipolar transistor for signal amplification being connected to the emitter of the first bipolar transistor, an input signal being inputted to the base of the bipolar transistor for signal amplification through a capacitor, an output signal being outputted from a collector of the bipolar transistor for signal amplification.

According to a specific configuration of an amplification circuit of a third embodiment of the invention, there is provided with an amplification circuit comprising:

a first bipolar transistor and a second bipolar transistor which are sequentially connected in series between a power supply potential node and a ground potential node;

a third bipolar transistor and a first diode-connected bipolar transistor which are sequentially connected in series between the power supply potential node and the ground potential node;

a first resistor which is connected between a control potential node and a base of the first bipolar transistor;

a fourth bipolar transistor in which a collector is connected to the base of the first bipolar transistor, a base is commonly connected to bases of the second bipolar transistor and the first diode-connected bipolar transistor, and an emitter is connected to the ground potential node;

a fifth bipolar transistor which is connected between an emitter of the first bipolar transistor and the ground potential node;

a sixth bipolar transistor in which a collector is connected to the power supply potential node and an emitter is connected to a base of the fifth bipolar transistor;

a second resistor which is connected between an emitter of the sixth bipolar transistor and the ground potential node;

a third resistor which is connected between the control potential node and a base of the sixth bipolar transistor;

a fourth resistor, a second diode-connected bipolar transistor, and a third diode-connected bipolar transistor which are sequentially connected in series between the base of the sixth bipolar transistor and the ground potential node; and a bipolar transistor for signal amplification which is connected between the power supply potential node and the ground potential node, a base of the bipolar transistor for signal amplification being connected to the emitter of the first bipolar transistor, an input signal being inputted to the base of the bipolar transistor for signal amplification through a capacitor, an output signal being outputted from a collector of the bipolar transistor for signal amplification.

According to an amplification circuit of a third embodiment of the invention, there is provided with an amplification circuit comprising:

a first resistor and a first bipolar transistor which are sequentially connected in series between a control potential node and a ground potential node;

a second bipolar transistor in which a collector is connected to a power supply potential node, a base is connected to a collector of the first bipolar transistor, and an emitter is connected to a base of the first bipolar transistor;

a second resistor which is connected between the emitter of the second bipolar transistor and the ground potential node;

a third bipolar transistor in which a collector is connected to the power supply potential node, a base is commonly connected to the base of the first bipolar transistor, and an emitter supplies a base bias current of a bipolar transistor for signal amplification;

a diode-connected bipolar transistor which is connected between the emitter of the third bipolar transistor and the ground potential node;

a third resistor which is connected between the control potential node and a connection node of the emitter of the third bipolar transistor and a collector of the diode-connected bipolar transistor; and the bipolar transistor for signal amplification which is connected between the power supply potential node and the ground potential node, a base of the bipolar transistor for signal amplification being connected to the emitter of the third bipolar transistor, an input signal being inputted to the base of the bipolar transistor for signal amplification through a capacitor, an output signal being outputted from a collector of the bipolar transistor for signal amplification.

DETAILED DESCRIPTION OF THE EMBODIMENTS

Embodiments of the bias current supply circuit and the amplification circuit of the invention will be described below referring to the accompanying drawings.

Figure 5:
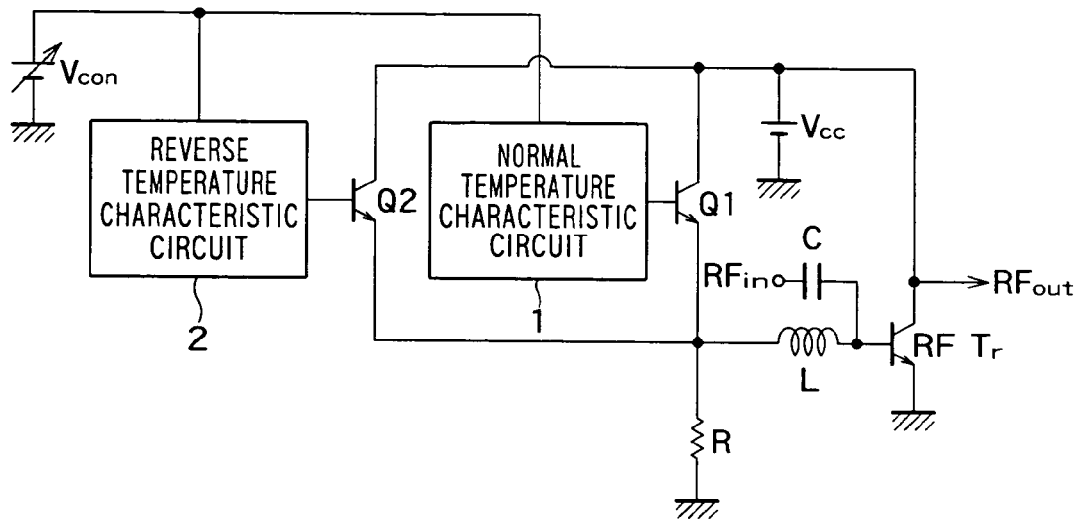
FIG. 5 is a circuit diagram showing a basic configuration of the bias current supply circuit and an amplification circuit according to a first embodiment of the invention.

FIG. 5 is the circuit diagram showing a basic configuration of the bias current supply circuit and the amplification circuit according to a first embodiment of the invention.

The bias current supply circuit according to the first embodiment of the invention includes a first bipolar transistor Q1 and a resistor R which are sequentially connected in series between the power supply potential node to which the power supply voltage $V_{cc}$ is supplied and the ground potential node, a second bipolar transistor Q2 which is connected in parallel with the first bipolar transistor Q1, a normal temperature characteristic circuit 1 which has normal temperature characteristics increasing an amount of current supply with increasing temperature and is operated by supply of the control voltage $V_{con}$ to control the base current supplied to the first bipolar transistor Q1, and a reverse temperature characteristic circuit 2 which has reverse temperature characteristics decreasing the amount of current supply with increasing temperature and is operated by the supply of the control voltage $V_{con}$ to control the base current supplied to the second bipolar transistor Q2. The base bias current of the bipolar transistor RFTr for RF signal amplification is supplied from the connection node between the first and second bipolar transistors Q1 and Q2 and the resistor R, i.e. the emitters of the first and second bipolar transistors Q1 and Q2 which are commonly connected.

The amplification circuit includes the bipolar transistor RFTr for RF signal amplification which is connected between the power supply potential node and the ground potential node. In the bipolar transistor RFTr for RF signal amplification, the base is connected to the emitters of the first and second bipolar transistors Q1 and Q2, the input RF signal $RF_{in}$ is inputted to the base through a capacitor C, and the output RF signal $RF_{out}$ is outputted from the collector.

In the configuration shown in FIG. 5, a choke inductor L for preventing the RF signal is inserted and connected between the base of the bipolar transistor RFTr for RF signal amplification and the emitters of the first and second bipolar transistors Q1 and Q2. However, it is arbitrary whether the choke inductor L is provided or not, and it is also possible to remove the choke inductor L to cause short circuit.

That is to say, the bias current supply circuit according to the first embodiment of the invention includes the first and second bipolar transistors Q1 and Q2 which form the two emitter followers cooperating to supply the base bias current of the bipolar transistor RFTr for RF signal amplification, the normal temperature characteristic circuit 1 which has the normal temperature characteristics increasing the amount of current supply with increasing temperature and supplies the base current to the first bipolar transistor Q1, and the reverse temperature characteristic circuit 2 which has the reverse temperature characteristics decreasing the amount of current supply with increasing temperature and supplies the base current to the second bipolar transistor Q2.

In the bias current supply circuit according to the first embodiment of the invention, since the base current supplied from the normal temperature characteristic circuit 1 to the first bipolar transistor Q1 is increased with increasing ambient temperature, while the emitter current of the first bipolar transistor Q1 is increased, the base current supplied from the reverse temperature characteristic circuit 2 to the second bipolar transistor Q2 is decreased. This allows the emitter current of the second bipolar transistor Q2 to be decreased.

On the contrary, since the base current supplied from the normal temperature characteristic circuit 1 to the first bipolar transistor Q1 is decreased with decreasing ambient temperature, while the emitter current of the first bipolar transistor Q1 is decreased, the base current supplied from the reverse temperature characteristic circuit 2 to the second bipolar transistor Q2 is increased. This allows the emitter current of the second bipolar transistor Q2 to be increased.

Accordingly, in the bipolar transistor RFTr for RF signal amplification whose base bias current is supplied by the cooperation of the two emitter followers formed by the first and second bipolar transistors Q1 and Q2, the fluctuation in base bias current caused by the temperature change is cancelled. As a result, the fluctuation in collector bias current of the bipolar transistor RFTr for RF signal amplification, which is caused by the temperature change, is suppressed to the minimum.

As described later, because each of the temperature characteristic circuit 1 and the reverse temperature characteristic circuit 2 can be formed by combination of the bipolar transistors which are turned on by the one-stage on-voltage Vbeon, the low-voltage operation can be realized in the control voltage $V_{con}$ of the bias current supply circuit according to the first embodiment of the invention.

Figure 6:
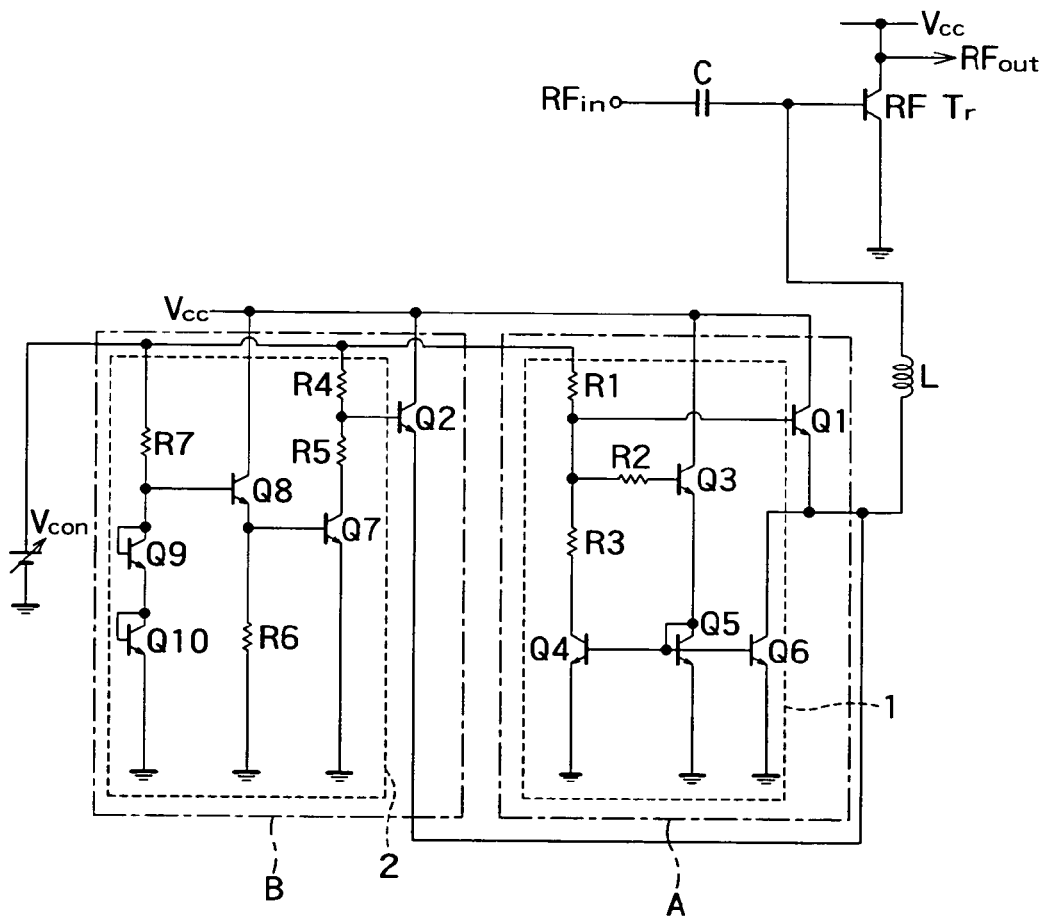
FIG. 6 is a circuit diagram showing an example of specific configurations of the bias current supply circuit and the amplification circuit according to the first embodiment of the invention.

FIG. 6 is the circuit diagram showing an example of specific configurations of the bias current supply circuit and the amplification circuit according to the first embodiment of the invention.

The bias current supply circuit according to the first embodiment of the invention includes bipolar transistors Q1 and Q6 which are sequentially connected in series between the power supply potential node to which the power supply voltage $V_{cc}$ is supplied and the ground potential node, a bipolar transistor Q3 and a diode-connected bipolar transistor Q5 which are sequentially connected in series between the power supply potential node and the ground potential node, a resistor R1 which is connected between the control potential node to which the control voltage $V_{con}$ is supplied and the base of the transistor Q1, a resistor R2 which is connected between the base of the transistor Q3 and the connection node of the base of the transistor Q1 and the resistor R1, a resistor R3 whose one end is connected to the base of the transistor Q1, a bipolar transistor Q4 in which the collector is connected to the other end of the resistor R3, the base is commonly connected to the bases of the transistors Q5 and Q6, and the emitter is connected to the ground potential node, a bipolar transistor Q2 which is connected between the power supply potential node and the emitter of the transistor Q1, a resistor R4 which is connected between the control potential node and the base of the transistor Q2, a resistor R5 and a bipolar transistor Q7 which are sequentially connected in series between the base of the transistor Q2 and the ground potential node, a bipolar transistor Q8 which is connected between the power supply potential node and the base of the transistor Q7, a resistor R6 which is connected between the emitter of the transistor Q8 and the ground potential node, a resistor R7 which is connected between the control potential node and the base of the transistor Q8, and diode-connected bipolar transistors Q9 and Q10 which are sequentially connected in series between the base of the transistor Q8 and the ground potential node.

The amplification circuit includes the bipolar transistor RFTr for RF signal amplification which is connected between the power supply potential node and the ground potential node. In the bipolar transistor RFTr for RF signal amplification, the base is connected to the emitters of the bipolar transistors Q1 and Q2, the input RF signal $RF_{in}$ is inputted to the base through a capacitor C, and the output RF signal $RF_{out}$ is outputted from the collector.

In the configuration shown in FIG. 6, a choke inductor L for preventing the RF signal is inserted and connected between the base of the bipolar transistor RFTr for RF signal amplification and the emitters of the bipolar transistors Q1 and Q2. However, it is arbitrary whether the choke inductor L is provided or not, and it is also possible to remove the choke inductor L to cause short circuit.

Further, the resistors R2 and R3 included in the bias current supply circuit according to the first embodiment of the invention shown in FIG. 6 also prevents the RF signal from leaking to the bias current supply circuit, it is arbitrary whether the resistors R2 and R3 are provided or not, and it is also possible to remove the resistors R2 and R3 to cause short circuit respectively.

The circuit including the transistors Q3, Q4, Q5, and Q6 and the resistors R1, R2, and R3 corresponds to the normal temperature characteristic circuit 1 shown in FIG. 5. The circuit including the transistor Q1 which is of the emitter follower in addition to the circuit including the transistors Q3, Q4, Q5, and Q6 and the resistors R1, R2, and R3 forms a bias current supply circuit A having the usual temperature characteristics.

Since the bias current supply circuit A has the usual temperature characteristics, the transistor Q1 which is of the emitter follower increases the base bias current supplied to the bipolar transistor RFTr for RF signal amplification when the ambient temperature is increased, and the transistor Q1 decreases the base bias current when the ambient temperature is decreased.

The transistors Q3, Q4, and Q5 form the current mirror circuit which sets a base potential of the transistor Q1. The transistor Q6 is one which sets a current value of the transistor Q1, and the base potential of the transistor Q6 is supplied from the current mirror circuit including the transistors Q3, Q4, and Q5.

The resistor R1 sets the current value of the transistor Q3, and the resistors R2 and R3 prevent the RF signal from leaking to the bias current supply circuit as described above.

The control voltage $V_{con}$ determines the collector currents of the transistor Q1 and the bipolar transistor RFTr for RF signal amplification, which are supplied from the power supply potential node.

The circuit including the transistors Q7, Q8, Q9, and Q10 and the resistors R4, R5, R6, and R7 corresponds to the reverse temperature characteristic circuit 2 shown in FIG. 5. The circuit including the transistor Q2 which is of the emitter follower in addition to the circuit including the transistors Q7, Q8, Q9, and Q10 and the resistors R4, R5, R6, and R7 forms a bias current supply circuit B having the reverse temperature characteristics.

Since the bias current supply circuit B has the reverse temperature characteristics, the transistor Q2 which is of the emitter follower decreases the base bias current supplied to the bipolar transistor RFTr for RF signal amplification when the ambient temperature is increased, and the transistor Q1 increases the base bias current when the ambient temperature is decreased.

The base potential of the transistor Q2 is set by the collector current of the transistor Q7 and the resistor R7.

The circuit including the transistors Q8, Q9, and Q10 and the resistors R5 and R6 is one which sets the base potential of the transistor Q7.

Since each of the bipolar transistors has the normal temperature characteristics, while the collector current passing through the transistor Q7 is increased with increasing ambient temperature, the collector current is decreased with decreasing ambient temperature. On the other hand, the base potential of the transistor Q2 which is of the emitter follower is determined by voltage drop caused by the resistor R4. Accordingly, while the base potential of the transistor Q2 is largely decreased with increasing ambient temperature, the base potential of the transistor Q2 is increased with decreasing ambient temperature.

As a result, although the transistor Q2 which is of the emitter follower supplies the sufficient base bias current to the bipolar transistor RFTr for RF signal amplification at a lower temperature, the transistor Q2 cannot supply the base bias current to the bipolar transistor RFTr for RF signal amplification at a higher temperature.

Accordingly, in the bipolar transistor RFTr for RF signal amplification whose base bias current is supplied by the cooperation of the two emitter followers formed by the transistors Q1 and Q2, the fluctuation in base bias current caused by the temperature change is cancelled. This allows the fluctuation in collector bias current of the bipolar transistor RFTr for RF signal amplification, which is caused by the temperature change, to be suppressed to the minimum.

Because each of the bias current supply circuit A and the bias current supply circuit B is formed by the combination of the bipolar transistors which are turned on by the one-stage on-voltage Vbeon, the low-voltage operation can be realized in the control voltage $V_{con}$ of the bias current supply circuit according to the first embodiment of the invention.

Figure 7:
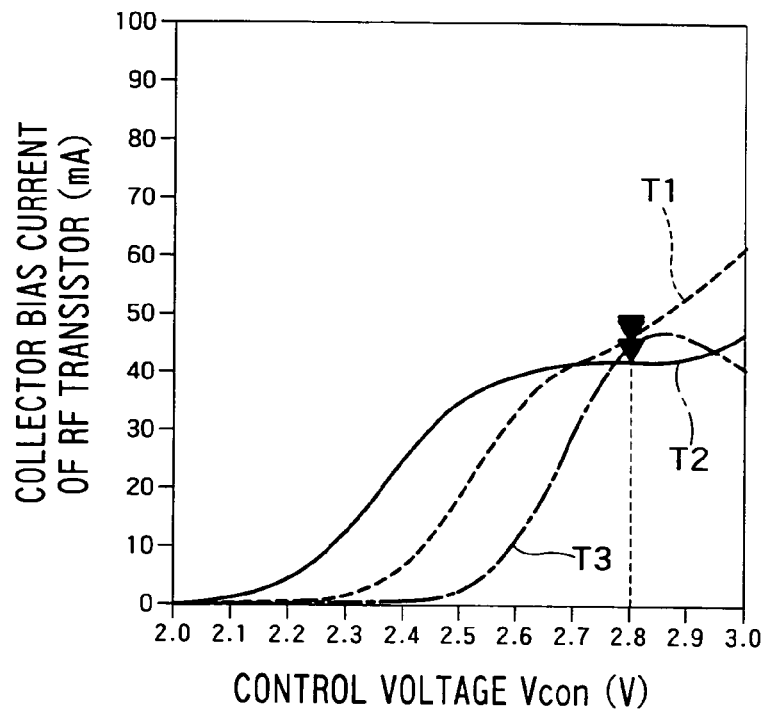
FIG. 7 is a graph showing the temperature characteristics of the collector bias current of the bipolar transistor for RF signal amplification to the control voltage $V_{con}$ in the case where the bias current supply circuit according to the first embodiment of the invention is used.
Figure 8:
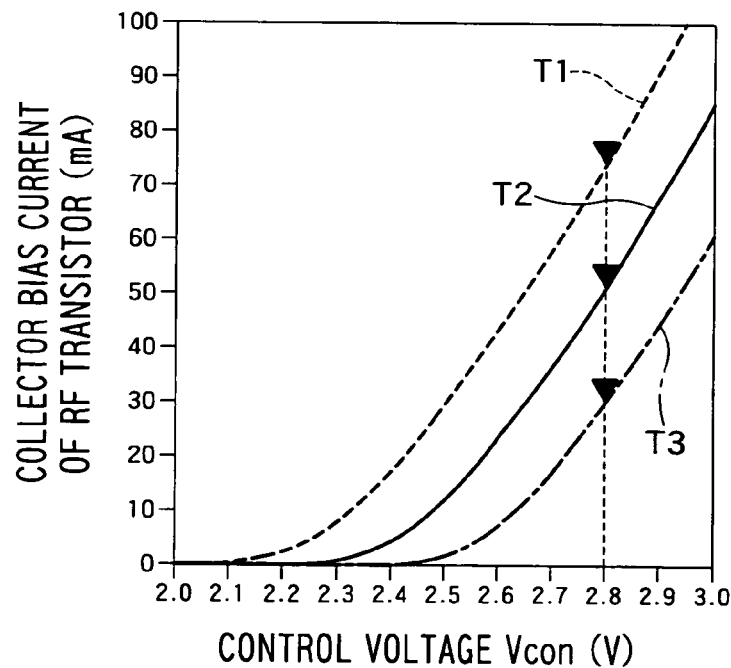
FIG. 8 is a graph showing the temperature characteristics of the collector bias current of the bipolar transistor for RF signal amplification to the control voltage $V_{con}$ in the case where only a bias current supply circuit A in the bias current supply circuit according to the first embodiment of the invention is used.

FIG. 7 is the graph showing the temperature characteristics of the collector bias current of the bipolar transistor for RF signal amplification to the control voltage $V_{con}$ in the case where the bias current supply circuit according to the first embodiment of the invention is used. FIG. 8 is the graph showing the temperature characteristics of the collector bias current of the bipolar transistor for RF signal amplification to the control voltage $V_{con}$ in the case where only the bias current supply circuit A in the bias current supply circuit according to the first embodiment of the invention is used. In FIGS. 7 and 8, the graphs T1, T2, and T3 show the temperature characteristics at ambient temperatures 80° C., 30° C., and −20° C. respectively.

In the measurement of the temperature characteristics, an indium gallium phosphide/gallium arsenide (InGaP/GaAs) heterojunction bipolar transistor is used as the bipolar transistor, and the forty eight bipolar transistors RFTr for RF signal amplification whose emitter size is 4×30 μm are used. In the bias current supply circuit, the eight transistors Q1 whose emitter size is 4×30 μm are used, the six transistors Q2 whose emitter size is 4×30 μm are used, the two transistors Q6 whose emitter size is 4×30 μm are used, and each one of the transistors Q3, Q4, Q5, Q7, Q8, Q9, and Q10 whose emitter size is 4×10 μm is used.

With respect to a resistance value of each resistor, the resistor R1 is 600Ω, the resistor R2 is 1000Ω, the resistor R3 is 100Ω, the resistor R4 is 1000Ω, the resistor R5 is 600Ω, the resistor R6 is 17000Ω, the resistor R7 is 2000Ω, and the resistor R8 is 200Ω.

The power supply voltage $V_{cc}$ is 3.4V, and the control voltage $V_{con}$ is variable in the range of 2.0V to 3.0V. However, each of the above setting values is set on the assumption that the control voltage $V_{con}$ is set to 2.8V.

As shown in the graphs of FIG. 7, in the case where the bias current supply circuit according to the first embodiment of the invention is used, when the control voltage $V_{con}$ is set to 2.8V, the collector bias currents of the bipolar transistor for RF signal amplification are 46 mA, 42 mA, and 45 mA at the ambient temperatures respectively, and it is found that the collector bias current is changed little. Even if the control voltage $V_{con}$ is fluctuated, it is found that the fluctuation in collector bias current of the bipolar transistor for RF signal amplification is suppressed to a relatively small value.

On the other hand, as shown in the graphs of FIG. 8, in the case where only the bias current supply circuit A in the bias current supply circuit according to the first embodiment of the invention is used, when the control voltage $V_{con}$ is set to 2.8V, the collector bias currents of the bipolar transistor for RF signal amplification are 75 mA, 52 mA, and 30 mA at the ambient temperatures respectively, and it is found that the collector bias current is largely changed.

That is to say, it is found that the use of the bias current supply circuit according to the first embodiment of the invention can suppress the fluctuation in collector bias current of the bipolar transistor for RF signal amplification, which is caused by the temperature change, to the minimum.

Figure 9:
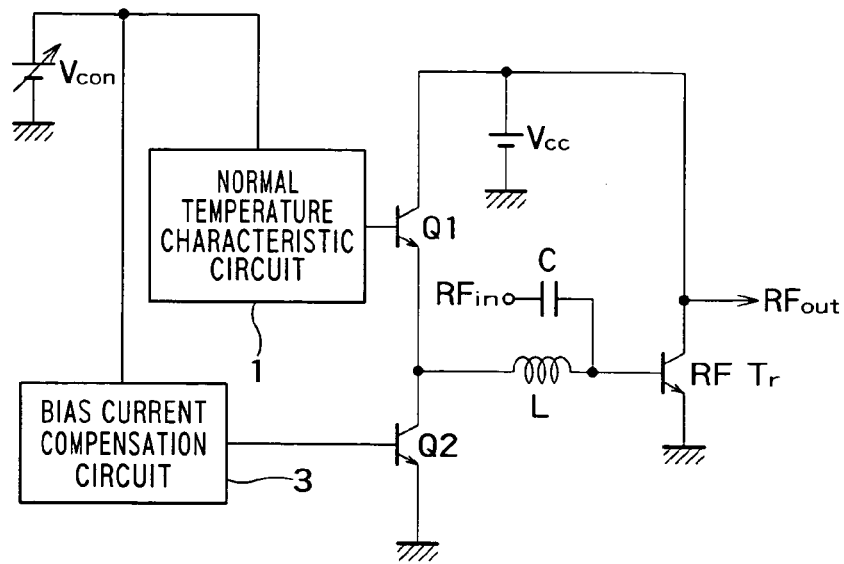
FIG. 9 is a circuit diagram showing the basic configuration of the bias current supply circuit and the amplification circuit according to a second embodiment of the invention.

FIG. 9 is the circuit diagram showing the basic configuration of the bias current supply circuit and the amplification circuit according to a second embodiment of the invention.

The bias current supply circuit according to the second embodiment of the invention includes a first bipolar transistors Q1 and a second bipolar transistor Q2 which are sequentially connected in series between the power supply potential node to which the power supply voltage $V_{cc}$ is supplied and the ground potential node, a normal temperature characteristic circuit 1 which has the normal temperature characteristics increasing the amount of current supply with increasing temperature and is operated by the supply of the control voltage $V_{con}$ to control the base current supplied to the first bipolar transistor Q1, and a bias current compensation circuit 3 which has the normal temperature characteristics increasing the amount of current supply with increasing temperature and controls the bias current supplied from the emitter of the first bipolar transistor Q1 in such a manner that the bias current compensation circuit is operated by the supply of the control voltage $V_{con}$ to control the base current supplied to the second bipolar transistor Q2. The base bias current of the bipolar transistor RFTr for RF signal amplification is supplied from the connection node between the first and second bipolar transistors Q1 and Q2, i.e. the emitter of the first bipolar transistor Q1.

The amplification circuit includes the bipolar transistor RFTr for RF signal amplification which is connected between the power supply potential node and the ground potential node. In the bipolar transistor RFTr for RF signal amplification, the base is connected to the emitter of the first bipolar transistor Q1, the input RF signal $RF_{in}$ is inputted to the base through a capacitor C, and the output RF signal $RF_{out}$ is outputted from the collector.

In the configuration shown in FIG. 9, a choke inductor L for preventing the RF signal is inserted and connected between the base of the bipolar transistor RFTr for RF signal amplification and the emitters of the first bipolar transistor Q1. However, it is arbitrary whether the choke inductor L is provided or not, and it is also possible to remove the choke inductor L to cause short circuit.

That is to say, the bias current supply circuit according to the second embodiment of the invention includes the first bipolar transistors Q1 which forms the emitter follower supplying the base bias current of the bipolar transistor RFTr for RF signal amplification, the second bipolar transistor Q2 which is connected in series to the first bipolar transistor Q1, the normal temperature characteristic circuit 1 which has the normal temperature characteristics increasing the amount of current supply with increasing temperature and supplies the base current to the first bipolar transistor Q1, and the bias current compensation circuit 3 which has the normal temperature characteristics increasing the amount of current supply with increasing temperature and suppresses the increase in base bias current with increasing ambient temperature by supplying the base current to the second bipolar transistor Q2 to passes a part of the base bias current supplied from the emitter of the first bipolar transistor Q1 through the second bipolar transistor Q2.

In the bias current supply circuit according to the second embodiment of the invention, since the base current supplied from the normal temperature characteristic circuit 1 to the first bipolar transistor Q1 is increased with increasing ambient temperature, while the emitter current of the first bipolar transistor Q1 is increased, the base current supplied from the bias current compensation circuit 3 to the second bipolar transistor Q2 is also increased. As a result, the current passing through the second bipolar transistor Q2 is increased in the emitter current of the first bipolar transistor Q1, and the increase in bias current supplied from the emitter of the first bipolar transistor Q1 is suppressed.

On the contrary, since the base current supplied from the normal temperature characteristic circuit 1 to the first bipolar transistor Q1 is decreased with decreasing ambient temperature, while the emitter current of the first bipolar transistor Q1 is decreased, the base current supplied from the bias current compensation circuit 3 to the second bipolar transistor Q2 is also decreased. As a result, the current passing through the second bipolar transistor Q2 is decreased in the emitter current of the first bipolar transistor Q1, a bias current suppression effect performed by the bias current compensation circuit 3 and the second bipolar transistor Q2 substantially disappears, and the most part of the emitter current of the first bipolar transistor Q1 is supplied as the bias current.

Accordingly, in the bipolar transistor RFTr for RF signal amplification whose base bias current is supplied by the emitter follower formed by the first bipolar transistor Q1, the fluctuation in base bias current caused by the temperature change is cancelled. As a result, the fluctuation in collector bias current of the bipolar transistor RFTr for RF signal amplification, which is caused by the temperature change, is suppressed to the minimum.

As described later, because each of the temperature characteristic circuit 1 and the bias current compensation circuit 3 can be formed by the combination of the bipolar transistors which are turned on by the one-stage on-voltage Vbeon, the low-voltage operation can be realized in the control voltage $V_{con}$ of the bias current supply circuit according to the second embodiment of the invention.

Figure 10:
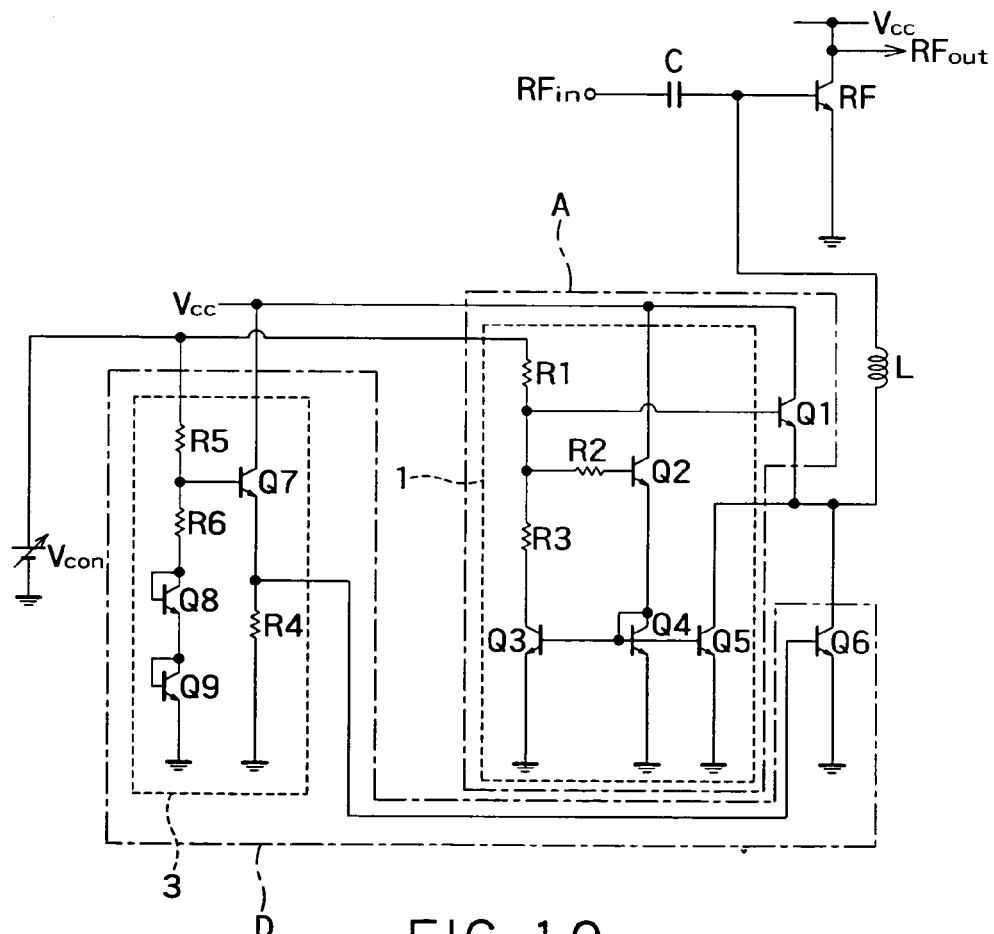
FIG. 10 is a circuit diagram showing a specific example of the bias current supply circuits and the amplification circuits according to the second embodiment of the invention.

FIG. 10 is the circuit diagram showing a specific example of the bias current supply circuits and the amplification circuits according to the second embodiment of the invention.

The bias current supply circuit according to the second embodiment of the invention includes bipolar transistors Q1 and Q5 which are sequentially connected in series between the power supply potential node to which the power supply voltage $V_{cc}$ is supplied and the ground potential node, a bipolar transistor Q2 and a diode-connected bipolar transistor Q4 which are sequentially connected in series between the power supply potential node and the ground potential node, a resistor R1 which is connected between the control potential node to which the control voltage $V_{con}$ is supplied and the base of the transistor Q1, a resistor R2 which is connected between the base of the transistor Q2 and the connection node of the base of the transistor Q1 and the resistor R1, a resistor R3 whose one end is connected to the base of the transistor Q1, a bipolar transistor Q3 in which the collector is connected to the other end of the resistor R3, the base is commonly connected to the bases of the transistors Q4 and Q5, and the emitter is connected to the ground potential node, a bipolar transistor Q6 which is connected between the emitter of the transistor Q1 and the ground potential node, a bipolar transistor Q7 in which the collector is connected to the power supply potential node and the emitter is connected to the base of the transistor Q6, a resistor R4 which is connected between the emitter of the transistor Q7 and the ground potential node, a resistor R5 which is connected between the control potential node and the base of the transistor Q7, and a resistor R6 and diode-connected bipolar transistors Q8 and Q9 which are sequentially connected in series between the base of the transistor Q7 and the ground potential node.

The amplification circuit includes the bipolar transistor RFTr for RF signal amplification which is connected between the power supply potential node and the ground potential node. In the bipolar transistor RFTr for RF signal amplification, the base is connected to the emitter of the bipolar transistor Q1, the input RF signal $RF_{in}$ is inputted to the base through a capacitor C, and the output RF signal $RF_{out}$ is outputted from the collector.

In the configuration shown in FIG. 10, a choke inductor L for preventing the RF signal is inserted and connected between the base of the bipolar transistor RFTr for RF signal amplification and the emitter of the bipolar transistor Q1. However, it is arbitrary whether the choke inductor L is provided or not, and it is also possible to remove the choke inductor L to cause short circuit.

Further, the resistors R2 and R3 included in the bias current supply circuit according to the second embodiment of the invention shown in FIG. 10 also prevent the RF signal from leaking to the bias current supply circuit, it is arbitrary whether the resistors R2 and R3 are provided or not, and it is also possible to remove the resistors R2 and R3 to cause short circuit respectively.

The circuit including the transistors Q2, Q3, Q4, and Q5 and the resistors R1, R2, and R3 corresponds to the normal temperature characteristic circuit 1 shown in FIG. 9. The circuit including the transistor Q1 which is of the emitter follower in addition to the circuit including the transistors Q2, Q3, Q4, and Q5 and the resistors R1, R2, and R3 forms a bias current supply circuit A having the usual temperature characteristics.

Since the bias current supply circuit A has the usual temperature characteristics, the transistor Q1 which is of the emitter follower increases the base bias current supplied to the bipolar transistor RFTr for RF signal amplification when the ambient temperature is increased, and the transistor Q1 decreases the base bias current when the ambient temperature is decreased.

The transistors Q2, Q3, and Q4 form the current mirror circuit which sets the base potential of the transistor Q1. The transistor Q5 is one which sets the current value of the transistor Q1, and the base potential of the transistor Q5 is supplied from the current mirror circuit including the transistors Q2, Q3, and Q4.

The resistor R1 sets the current value of the transistor Q2, and the resistors R2 and R3 prevent the RF signal from leaking to the bias current supply circuit as described above.

The control voltage $V_{con}$ determines the collector currents of the transistor Q1 and the bipolar transistor RFTr for RF signal amplification, which are supplied from the power supply potential node.

The circuit including the transistors Q7, Q8, and Q9 and the resistors R4, R5, and R6 corresponds to the bias current compensation circuit 3 shown in FIG. 9. The circuit including the transistor Q6 in addition to the circuit including the transistors Q7, Q8, and Q9 and the resistors R4, R5, and R6 forms a bias current compensation circuit D.

The circuit including the transistors Q7, Q8, and Q9 and the resistors R4, R5, and R6 is one which sets the base potential of the transistor Q6 which is connected in series to the transistor Q1 and in parallel with the transistor Q5.

Since each of the bipolar transistors has the normal temperature characteristics, while the emitter current passing through the transistor Q7 is increased with increasing ambient temperature, the emitter current is decreased with decreasing ambient temperature. Accordingly, while the base potential of the transistor Q6 is increased with increasing ambient temperature, the base potential of the transistor Q6 is decreased with decreasing ambient temperature.

As a result, the emitter potential of the transistor Q1 which is of the emitter follower is maintained at a relatively higher value when the ambient temperature is low, and the emitter potential of the transistor Q1 is relatively largely decreased when the ambient temperature is high.

When the ambient temperature is increased, since the base current supplied to the transistor Q1 which is of the emitter follower is increased, while the emitter current of the transistor Q1 is increased, the base current supplied to the transistor Q6 which is connected in series to the transistor Q1 and in parallel with the transistor Q5 is also increased. Consequently, the current passing through the transistor Q6 is increased in the emitter current of the transistor Q1 and becomes larger than the current passing through the transistor Q5, so that the increase in bias current supplied from the emitter of the transistor Q1 is suppressed.

On the contrary, when the ambient temperature is decreased, since the base current supplied to the transistor Q1 is decreased, while the emitter current of the transistor Q1 is decreased, the base current supplied to the transistor Q6 is also decreased. Consequently, the current passing through the transistor Q6 is decreased in the emitter current of the transistor Q1, the bias current suppression effect performed by the bias current compensation circuit D substantially disappears, and the most part of the emitter current of the bipolar transistor Q1 is supplied as the bias current.

Accordingly, in the bipolar transistor RFTr for RF signal amplification whose base bias current is supplied by the emitter follower formed by the bipolar transistor Q1, the fluctuation in base bias current caused by the temperature change is cancelled. As a result, the fluctuation in collector bias current of the bipolar transistor RFTr for RF signal amplification, which is caused by the temperature change, is suppressed to the minimum.

Because each of the bias current supply circuit A and the bias current compensation circuit D is formed by the combination of the bipolar transistors which are turned on by the one-stage on-voltage Vbeon, the low-voltage operation can be realized in the control voltage $V_{con}$ of the bias current supply circuit according to the second embodiment of the invention.

Figure 11:
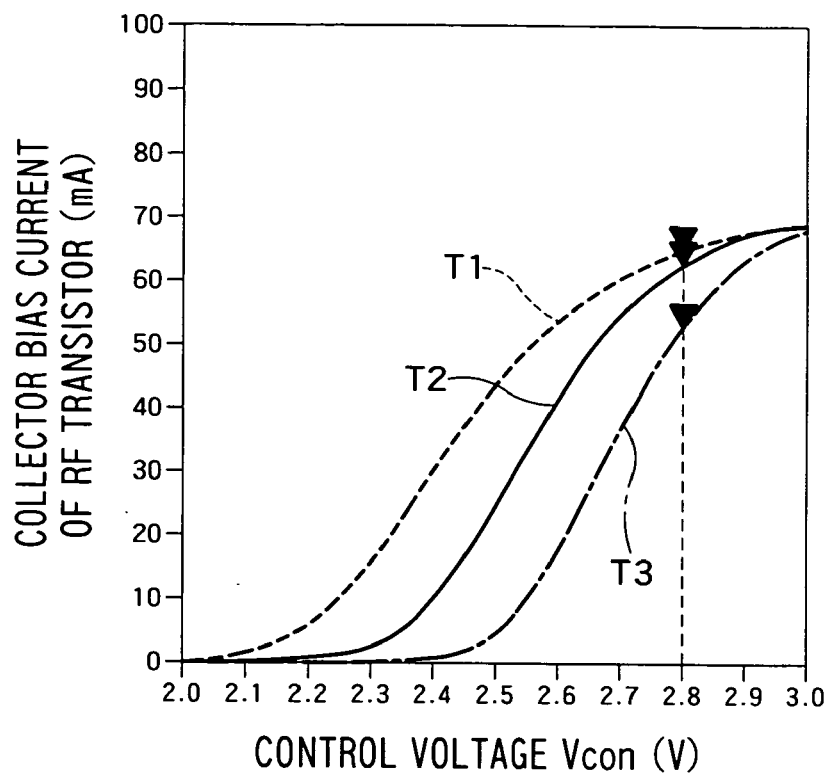
FIG. 11 is a graph showing the temperature characteristics of the collector bias current of the bipolar transistor for RF signal amplification to the control voltage $V_{con}$ in the case where the bias current supply circuit according to the second embodiment of the invention is used.

FIG. 11 is the graph showing the temperature characteristics of the collector bias current of the bipolar transistor for RF signal amplification to the control voltage $V_{con}$ in the case where the bias current supply circuit according to the second embodiment of the invention is used. In FIG. 11, the graphs T1, T2, and T3 show the temperature characteristics at ambient temperatures 80° C., 30° C., and −20° C. respectively.

In the bias current supply circuit A included in the bias current supply circuit according to the second embodiment of the invention, although some of reference signs or numerals are different, the circuit configuration is completely the same as the bias current supply circuit A included in the bias current supply circuit according to the first embodiment of the invention. Accordingly, in the case where only the bias current supply circuit A in the bias current supply circuit according to the second embodiment of the invention is used, the graphs showing the temperature characteristics of the collector bias current of the bipolar transistor for RF signal amplification to the control voltage $V_{con}$ are completely the same as the graphs shown in FIG. 8.

In the measurement of the temperature characteristics, the indium gallium phosphide/gallium arsenide (InGaP/GaAs) heterojunction bipolar transistor is used as the bipolar transistor, and the forty eight bipolar transistors for RF signal amplification RFTr whose emitter size is 4×30 µm are used. In the bias current supply circuit, the eight transistors Q1 whose emitter size is 4×30 µm are used, each two of the transistors Q5 and Q6 whose emitter size is 4×30 µm are used, the two transistors Q7 whose emitter size is 4×10 µm are used, and each of the transistors Q2, Q3, Q4, Q7, Q8, and Q9 whose emitter size is 4×10 µm is used.

With respect to a resistance value of each resistor, the resistor R1 is 600Ω, the resistor R2 is 1000Ω, the resistor R3 is 100Ω, the resistor R4 is 600Ω, the resistor R5 is 3000Ω, and the resistor R6 is 400Ω.

The power supply voltage $V_{cc}$ is 3.4V, and the control voltage $V_{con}$ is variable in the range of 2.0V to 3.0V. However, each of the above setting values is set on the assumption that the control voltage $V_{con}$ is set to 2.8V.

As shown in the graphs of FIG. 11, in the case where the bias current supply circuit according to the second embodiment of the invention is used, when the control voltage $V_{con}$ is set to 2.8V, the collector bias currents of the bipolar transistor for RF signal amplification are 65 mA, 62 mA, and 54 mA at the ambient temperatures respectively, and it is found that the collector bias current is changed little. Even if the control voltage $V_{con}$ is fluctuated, it is found that the fluctuation in collector bias current of the bipolar transistor for RF signal amplification is suppressed to a relatively small value.

On the other hand, as shown in the graphs of FIG. 8, in the case where only the bias current supply circuit A in the bias current supply circuit according to the second embodiment of the invention is used, when the control voltage $V_{con}$ is set to 2.8V, the collector bias currents of the bipolar transistor for RF signal amplification are 75 mA, 52 mA, and 30 mA at the ambient temperatures respectively, and it is found that the collector bias current is largely changed.

That is to say, it is found that the use of the bias current supply circuit according to the second embodiment of the invention can suppress the fluctuation in collector bias current of the bipolar transistor for RF signal amplification, which is caused by the temperature change, to the minimum.

Figure 12:
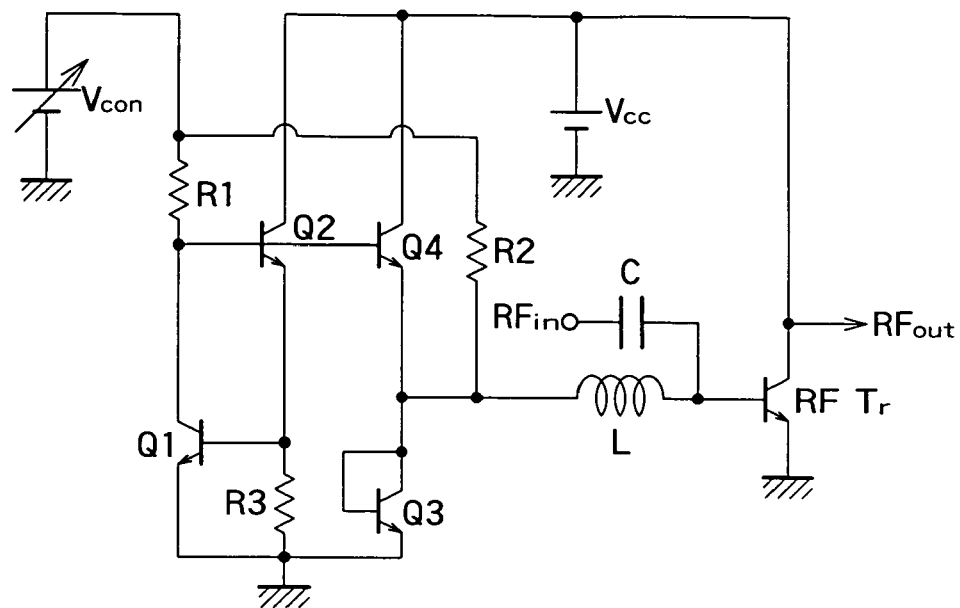
FIG. 12 is a circuit diagram showing the configuration of the bias current supply circuit and the amplification circuit according to a third embodiment of the invention.

FIG. 12 is the circuit diagram showing the configuration of the bias current supply circuit and the amplification circuit according to a third embodiment of the invention.

The bias current supply circuit according to the third embodiment of the invention includes a resistor R1 and a bipolar transistor Q1 which are sequentially connected in series between the control potential node to which the control voltage $V_{con}$ is supplied and the ground potential node, a bipolar transistor Q2 in which the collector is connected to the power supply potential node to which the power supply voltage $V_{cc}$ is supplied, the base is connected to the collector of the transistor Q1, and the emitter is connected to the base of the transistor Q1, a resistor R3 which is connected between the emitter of the transistor Q2 and the ground potential node, a bipolar transistor Q4 in which the collector is connected to the power supply potential node and the base is commonly connected to the base of the transistor Q1, a diode-connected bipolar transistor Q3 which is connected between the emitter of the transistor Q4 and the ground potential node, and a resistor R2 which is connected between the control potential node and the connection node of the emitter of the transistor Q4 and the collector of the transistor Q3. The base bias current of the bipolar transistor RFTr for RF signal amplification is supplied from the connection node between the emitter of the bipolar transistors Q4 and the collector of the transistor Q3.

The amplification circuit includes the bipolar transistor RFTr for RF signal amplification which is connected between the power supply potential node and the ground potential node. In the bipolar transistor RFTr for RF signal amplification, the base is connected to the connection node between the emitter of the transistor Q4 and the collector of the transistor Q3, the input RF signal $RF_{in}$ is inputted to the base through a capacitor C, and the output RF signal $RF_{out}$ is outputted from the collector.

In the configuration shown in FIG. 12, a choke inductor L for preventing the RF signal is inserted and connected between the base of the bipolar transistor RFTr for RF signal amplification and the connection node of the emitter of the transistor Q4 and the collector of the transistor Q3. However, it is arbitrary whether the choke inductor L is provided or not, and it is also possible to remove the choke inductor L to cause short circuit.

Figure 1:
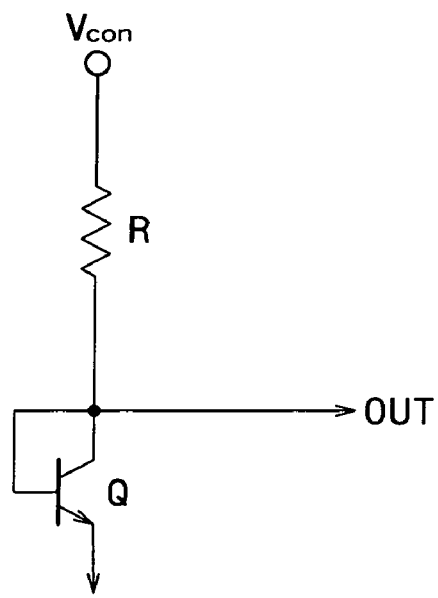
FIG. 1 is a circuit diagram of a first example of the conventional current mirror type base bias current supply circuits.
Figure 2:
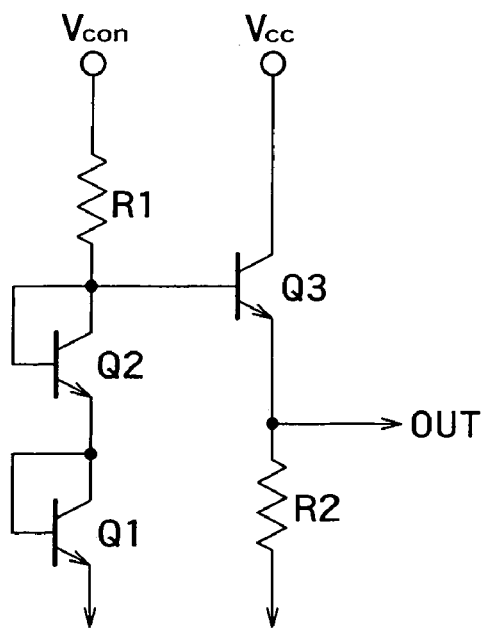
FIG. 2 is a circuit diagram of a second example of the conventional current mirror type base bias current supply circuits.
Figure 3:
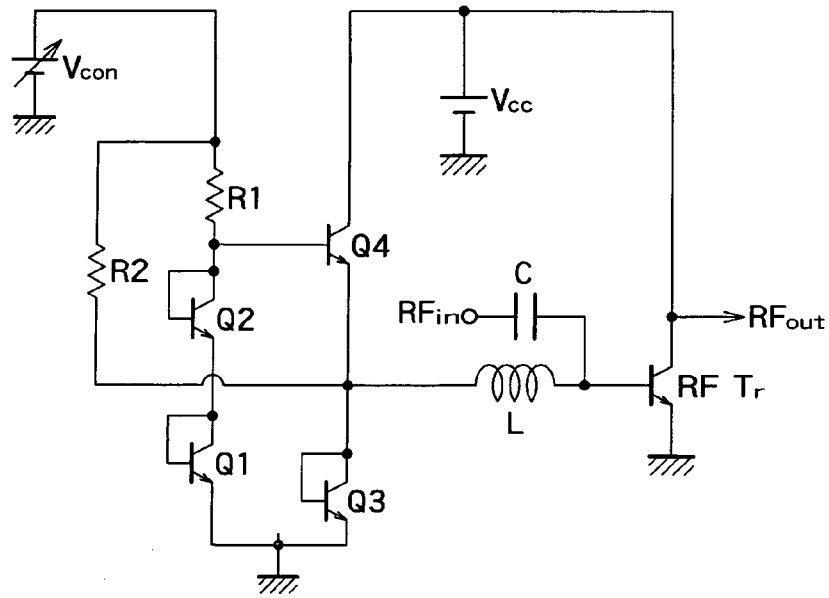
FIG. 3 is a circuit diagram of a third example of the conventional current mirror type base bias current supply circuits.

The bias current supply circuit according to the third embodiment of the invention is one in which the conventional bias current supply circuit shown in FIG. 3 is improved. While the transistor Q2 is inserted and connected in series between the resistor R1 and the transistor Q1 in the conventional bias current supply circuit shown in FIG. 3, the transistor Q2 is removed from between the resistor R1 and the transistor Q1 in the bias current supply circuit according to the third embodiment of the invention, and the transistor Q2 and the resistor R3 are sequentially connected in series between the power supply potential node and the ground potential node.

In the bias current supply circuit according to the third embodiment of the invention, the transistors Q2 and Q4 function as the emitter follower, and the transistor Q1 sets the base potentials of the transistors Q2 and Q4. During the high output of the amplification circuit, the transistor Q4 supplies the base bias current to the bipolar transistor RFTr for RF signal amplification.

In the bias current supply circuit according to the third embodiment of the invention as well as the conventional bias current supply circuit, the resistor R2 and the diode-connected bipolar transistor Q3 are used in order that the idle current passes through.

In the conventional bias current supply circuit, since the two transistors Q1 and Q2 are connected in series, the currents passing through the transistors Q1 and Q2 are determined by current $Icon=(V_{con}-2Vbeon)/2$ (Vbeon is on-voltage of transistor) which passes through the resistor R1. Accordingly, when the on-voltage Vbeon of the transistor is fluctuated according to the change in ambient temperature, the fluctuation is doubled and reflected in the fluctuation in current Icon, and the current Icon is largely fluctuated. For example, assuming that the on-voltage Vbeon of the transistor is fluctuated from 1.2V to 1.3V according to the change in ambient temperature when the control voltage $V_{con}$ is set to 2.8V, the amount of fluctuation in on-voltage Vbeon of the two-stage transistors becomes 0.1V+0.1V=0.2V, and the current Icon is largely fluctuated from 0.66 mA to 0.33 mA. As a result, the current value of the transistor Q4 which is of the emitter follower is largely decreased under the influence of the temperature change, and the amount of supply of the base bias current to the bipolar transistor RFTr for RF signal amplification is also decreased.

On the other hand, in the bias current supply circuit according to the third embodiment of the invention, the resistor R1 and the transistor Q1 which are sequentially connected in series and the transistor Q2 and the resistor R3 which are sequentially connected in series form the circuits in parallel with each other. Accordingly, even if the on-voltage Vbeon of the transistor is fluctuated according to the change in ambient temperature, only the amount of fluctuation in on-voltage Vbeon of the one transistor Q1 is reflected in the fluctuation in current Icon passing through the resistor R1, and constant-current characteristic of the transistor Q2 is maintained by the resistor R3. As a result, the fluctuation in current value of the transistor Q4 which is of the emitter follower is suppressed to a small value, and the fluctuation in base bias current supplied to the bipolar transistor RFTr for RF signal amplification is also suppressed to a small value.

Figure 13:
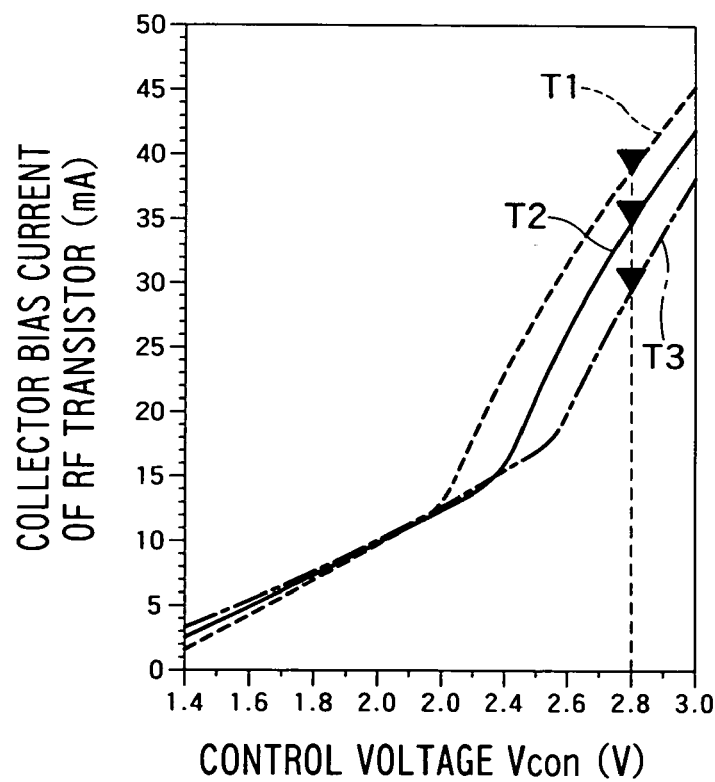
FIG. 13 a graph showing the temperature characteristics of the collector bias current of the bipolar transistor for RF signal amplification to the control voltage $V_{con}$ in the case where the bias current supply circuit according to the third embodiment of the invention is used.

FIG. 13 is the graph showing the temperature characteristics of the collector bias current of the bipolar transistor for RF signal amplification to the control voltage $V_{con}$ in the case where the bias current supply circuit according to the third embodiment of the invention is used. In FIG. 13, the graphs T1, T2, and T3 show the temperature characteristics at ambient temperatures 90° C., 30° C., and −30° C. respectively.

In the measurement of the temperature characteristics, the indium gallium phosphide/gallium arsenide (InGaP/GaAs) heterojunction bipolar transistor is used as the bipolar transistor, and the forty eight bipolar transistors for RF signal amplification RFTr whose emitter size is 4×30 μm are used. In the bias current supply circuit, each one of the transistors Q1 and Q2 whose emitter size is 4×10 μm are used, the one transistor Q3 whose emitter size is 4×20 μm is used, and the eight transistors Q4 whose emitter size is 4×30 μm are used.

With respect to a resistance value of each resistor, the resistor R1 is 600Ω, the resistor R2 is 5000Ω, and the resistor R3 is 3000Ω.

The power supply voltage $V_{cc}$ is 3.4V, and the control voltage $V_{con}$ is variable in the range of 1.4V to 3.0V. However, each of the above setting values is set on the assumption that the control voltage $V_{con}$ is set to 2.8V.

As shown in the graphs of FIG. 13, in the case where the bias current supply circuit according to the third embodiment of the invention is used, when the control voltage $V_{con}$ is set to 2.8V, the collector bias currents of the bipolar transistor for RF signal amplification are 39 mA, 35 mA, and 30 mA at the ambient temperatures respectively, and it is found that the fluctuation in collector bias current is suppressed to a very small value.

Figure 4:
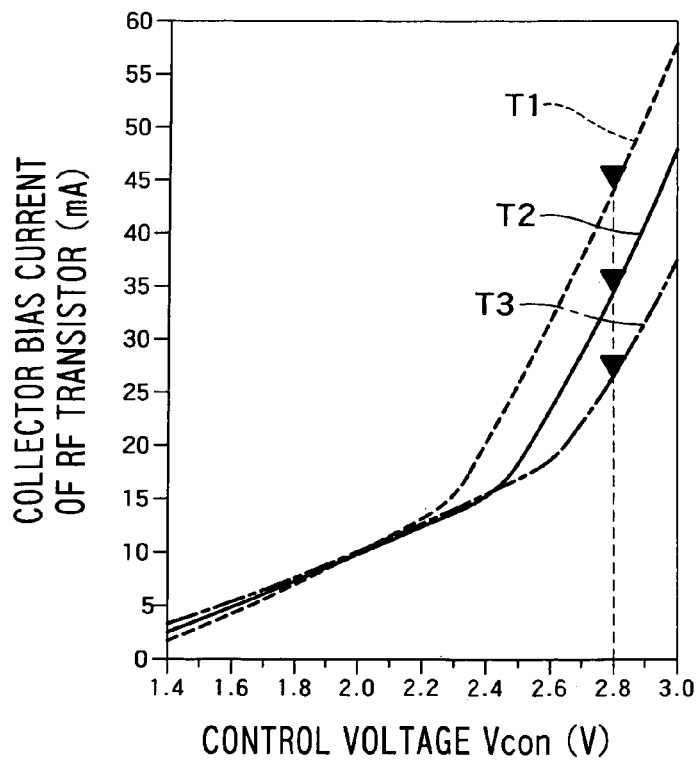
FIG. 4 is a graph showing temperature characteristics of a collector bias current of a bipolar transistor for RF signal amplification to control voltage $V_{con}$ in the case where the conventional current mirror type base bias current supply circuit shown in FIG. 3 is used.

On the other hand, as shown in the graphs of FIG. 4, in the case where the conventional bias current supply circuit shown in FIG. 3 is used, when the control voltage $V_{con}$ is set to 2.8V, the collector bias currents of the bipolar transistor for RF signal amplification are 45 mA, 35 mA, and 27 mA at the ambient temperatures respectively, and it is found that the collector bias current is largely changed.

That is to say, it is found that the use of the bias current supply circuit according to the third embodiment of the invention can suppress the fluctuation in collector bias current of the bipolar transistor for RF signal amplification, which is caused by the temperature change, to the minimum.

Figure 14:
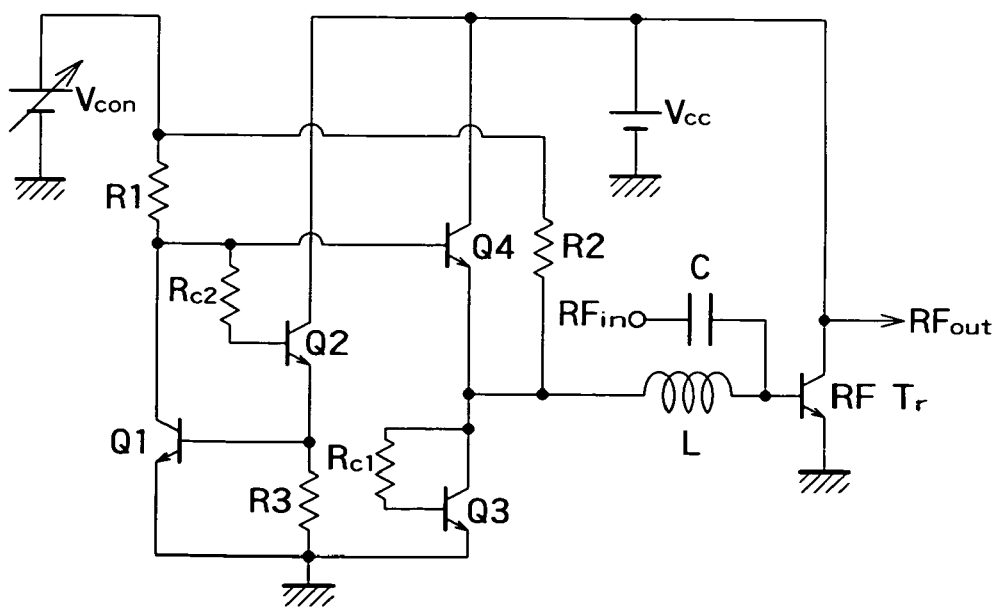
FIG. 14 is a circuit diagram showing the configuration of a modification of the bias current supply circuits and the amplification circuits according to the third embodiment of the invention.

FIG. 14 is the circuit diagram showing the configuration of a modification of the bias current supply circuits and the amplification circuits according to the third embodiment of the invention.

The modification of the bias current supply circuit according to the third embodiment of the invention differs from the bias current supply circuit according to the third embodiment of the invention shown in FIG. 12 in that the modification further includes a resistor Rc1 which is inserted and connected between the base and the collector of the transistor Q3 and a resistor Rc2 which is inserted and connected between the base of the transistor Q2 and the collector of the transistor Q1.

In the case where the setting values of each transistor, each resistor, the power supply voltage $V_{cc}$, and the control voltage $V_{con}$ are set as written in the description of FIG. 13, it is prefer to set the resistance values of the resistors Rc1 and Rc2 to 1000Ω respectively.

By inserting and connecting the resistors Rc1 and Rc2, while the temperature characteristics shown in the graph of FIG. 13 are realized, the output impedance of the bias current supply circuit becomes low at a low frequency and the output impedance becomes high at a high frequency, so that the choke inductor L for preventing the RF signal is not required. Even if the resistors Rc1 and Rc2 are inserted and connected, from the viewpoint of direct current, the temperature characteristics of the bias current is substantially equal to the temperature characteristics shown in FIG. 13, as long as the current gain is more than 100.

The prevention of the RF signal by the resistors Rc1 and Rc2 is the effect utilizing beta frequency characteristics of the transistor. From the view point of direct current, the resistors Rc1 and Rc2 only show the resistors in series of about 10Ω. However, from the view point of alternate current in the range of a radio frequency (RF), the resistors Rc1 and Rc2 show the resistors in series more than 100Ω, so that the effect of the prevention of the RF signal can be obtained.

The basic configuration of the bias current supply circuit and the amplification circuit according to the first embodiment of the invention includes the first and second bipolar transistors which form the two emitter followers cooperating to supply the base bias current of the bipolar transistor for signal amplification, the normal temperature characteristic circuit which has the normal temperature characteristics increasing the amount of current supply with increasing temperature and supplies the base current to the first bipolar transistor, and the reverse temperature characteristic circuit which has the reverse temperature characteristics decreasing the amount of current supply with increasing temperature and supplies the base current to the second bipolar transistor. As a result, the fluctuation in collector current caused by the temperature change can be suppressed in the linear high-efficiency, high-power amplification circuit which is operated by low power supply voltage.

The basic configuration of the bias current supply circuit and the amplification circuit according to the second embodiment of the invention includes the first bipolar transistors which forms the emitter follower supplying the base bias current of the bipolar transistor for signal amplification, the second bipolar transistor which is connected in series to the first bipolar transistor, the normal temperature characteristic circuit which has the normal temperature characteristics increasing the amount of current supply with increasing temperature and supplies the base current to the first bipolar transistor, and the bias current compensation circuit which has the normal temperature characteristics increasing the amount of current supply with increasing temperature and suppresses the increase in base bias current with increasing ambient temperature by supplying the base current to the second bipolar transistor to pass a part of the base bias current supplied from the emitter of the first bipolar transistor through the second bipolar transistor. As a result, the fluctuation in collector current caused by the temperature change can be suppressed in the linear high-efficiency, high-power amplification circuit which is operated by low power supply voltage.

The bias current supply circuit and the amplification circuit according to the third embodiment of the invention include the first resistor and the first bipolar transistor which are sequentially connected in series between the control potential node and the ground potential node, the second bipolar transistor in which the collector is connected to the power supply potential node, the base is connected to the collector of the first bipolar transistor, and the emitter is connected to the base of the first bipolar transistor, the second resistor which is connected between the emitter of the second bipolar transistor and the ground potential node, the third bipolar transistor in which the collector is connected to the power supply potential node, the base is commonly connected to the base of the first bipolar transistor, and the emitter supplies the base bias current of the bipolar transistor for signal amplification, the diode-connected bipolar transistor which is connected between the emitter of the third bipolar transistor and the ground potential node, and the third resistor which is connected between the control potential node and the connection node of the emitter of the third bipolar transistor and the collector of the diode-connected bipolar transistor. As a result, the fluctuation in collector current caused by the temperature change can be suppressed in the linear high-efficiency, high-power amplification circuit which is operated by low power supply voltage.

What is claimed is:

1. A bias current supply circuit comprising:
   a first bipolar transistor and a second bipolar transistor which form two emitter followers cooperating to supply a base bias current of a bipolar transistor for signal amplification;

a normal temperature characteristic circuit which has normal temperature characteristics increasing an amount of current supply with increasing temperature and supplies a base current to said first bipolar transistor; and a reverse temperature characteristic circuit which has reverse temperature characteristics decreasing the amount of current supply with increasing temperature and supplies a base current to said second bipolar transistor.

2. A bias current supply circuit comprising:

a first bipolar transistor and a resistor which are sequentially connected in series between a power supply potential node and a ground potential node;

a second bipolar transistor which is connected in parallel with said first bipolar transistor;

a normal temperature characteristic circuit which has normal temperature characteristics increasing an amount of current supply with increasing temperature and is operated by supply of a control voltage to control a base current supplied to said first bipolar transistor; and a reverse temperature characteristic circuit which has reverse temperature characteristics decreasing the amount of current supply with increasing temperature and is operated by the supply of the control voltage to control a base current supplied to said second bipolar transistor, wherein a base bias current of a bipolar transistor for signal amplification is supplied from emitters of said first and second bipolar transistors which are commonly connected.

3. A bias current supply circuit comprising:

a first bipolar transistor and a second bipolar transistor which are sequentially connected in series between a power supply potential node and a ground potential node;

a third bipolar transistor and a first diode-connected bipolar transistor which are sequentially connected in series between the power supply potential node and the ground potential node;

a first resistor which is connected between a control potential node and a base of said first bipolar transistor;

a fourth bipolar transistor in which a collector is connected to the base of said first bipolar transistor, a base is commonly connected to bases of said second bipolar transistor and said first diode-connected bipolar transistor, and an emitter is connected to the ground potential node;

a fifth bipolar transistor which is connected between the power supply potential node and an emitter of said first bipolar transistor;

a second resistor which is connected between the control potential node and a base of said fifth bipolar transistor;

a third resistor and a sixth bipolar transistor which are sequentially connected in series between the base of said fifth bipolar transistor and the ground potential node;

a seventh bipolar transistor which is connected between the power supply potential node and a base of said sixth bipolar transistor;

a fourth resistor which is connected between an emitter of said seventh bipolar transistor and the ground potential node;

a fifth resistor which is connected between the control potential node and a base of said seventh bipolar transistor; and a second diode-connected bipolar transistor and a third diode-connected bipolar transistor which are sequentially connected in series between the base of said seventh bipolar transistor and the ground potential node.

4. A bias current supply circuit according to claim 3, further comprising:

a sixth resistor which is inserted and connected between a base of said third bipolar transistor and a connection node of the base of said first bipolar transistor and said first resistor; and a seventh resistor which is inserted and connected between the collector of said fourth bipolar transistor and the connection node of the base of said first bipolar transistor and said first resistor.

5. An amplification circuit comprising:

a first bipolar transistor and a second bipolar transistor which form two emitter followers cooperating to supply a base bias current of a bipolar transistor for signal amplification;

a normal temperature characteristic circuit which has normal temperature characteristics increasing an amount of current supply with increasing temperature and supplies a base current to said first bipolar transistor;

a reverse temperature characteristic circuit which has reverse temperature characteristics decreasing the amount of current supply with increasing temperature and supplies a base current to said second bipolar transistor; and the bipolar transistor for signal amplification which is connected between a power supply potential node and a ground potential node, a base of said bipolar transistor for signal amplification being connected to emitters of said first and second bipolar transistors, an input signal being inputted to a base of said bipolar transistor for signal amplification through a capacitor, an output signal being outputted from a collector of said bipolar transistor for signal amplification.

6. An amplification circuit according to claim 5, further comprising a choke inductor which is inserted and connected between the base of said bipolar transistor for signal amplification and the emitters of said first and second bipolar transistors.

7. An amplification circuit comprising:

a first bipolar transistor and a resistor which are sequentially connected in series between a power supply potential node and a ground potential node;

a second bipolar transistor which is connected in parallel with said first bipolar transistor;

a normal temperature characteristic circuit which has normal temperature characteristics increasing an amount of current supply with increasing temperature and is operated by supply of a control voltage to control a base current supplied to said first bipolar transistor;

a reverse temperature characteristic circuit which has reverse temperature characteristics decreasing the amount of current supply with increasing temperature and is operated by the supply of said control voltage to control a base current supplied to said second bipolar transistor; and a bipolar transistor for signal amplification which is connected between the power supply potential node and the ground potential node, a base of said bipolar transistor for signal amplification being connected to emitters of said first and second bipolar transistors, an input signal being inputted to a base of said bipolar transistor for signal amplification through a capacitor, an output signal being outputted from a collector of said bipolar transistor for signal amplification.

8. An amplification circuit according to claim 7, further comprising a choke inductor which is inserted and connected between the base of said bipolar transistor for signal amplification and the emitters of said first and second bipolar transistors.

9. An amplification circuit comprising:
a first bipolar transistor and a second bipolar transistor which are sequentially connected in series between a power supply potential node and a ground potential node;
a third bipolar transistor and a first diode-connected bipolar transistor which are sequentially connected in series between the power supply potential node and the ground potential node;
a first resistor which is connected between a control potential node and a base of said first bipolar transistor;
a fourth bipolar transistor in which a collector is connected to the base of said first bipolar transistor, a base is commonly connected to bases of said second bipolar transistor and said first diode-connected bipolar transistor, and an emitter is connected to the ground potential node;
a fifth bipolar transistor which is connected between the power supply potential node and an emitter of said first bipolar transistor;
a second resistor which is connected between the control potential node and a base of said fifth bipolar transistor;
a third resistor and a sixth bipolar transistor which are sequentially connected in series between the base of said fifth bipolar transistor and the ground potential node;
a seventh bipolar transistor which is connected between the power supply potential node and a base of said sixth bipolar transistor;
a fourth resistor which is connected between an emitter of said seventh bipolar transistor and the ground potential node;
a fifth resistor which is connected between the control potential node and a base of said seventh bipolar transistor;
a second diode-connected bipolar transistor and a third diode-connected bipolar transistor which are sequentially connected in series between the base of said seventh bipolar transistor and the ground potential node; and
a bipolar transistor for signal amplification which is connected between the power supply potential node and the ground potential node, a base of said bipolar transistor for signal amplification being connected to the emitter of said first bipolar transistor and an emitter of said fifth bipolar transistor, an input signal being inputted to the base of said bipolar transistor for signal amplification through a capacitor, an output signal being outputted from an collector of said bipolar transistor for signal amplification.

10. An amplification circuit according to claim 9, further comprising:
a sixth resistor which is inserted and connected between a base of said third bipolar transistor and a connection node of the base of said first bipolar transistor and said first resistor; and
a seventh resistor which is inserted and connected between a collector of said fourth bipolar transistor and the connection node of the base of said first bipolar transistor and said first resistor.

11. An amplification circuit according to claim 9, further comprising a choke inductor which is inserted and connected between the base of said bipolar transistor for signal amplification and the emitters of said first and fifth bipolar transistors.

* * * * *